US007919710B2

(12) United States Patent
Lu et al.

(10) Patent No.: US 7,919,710 B2
(45) Date of Patent: Apr. 5, 2011

(54) SOLAR CELL CONTAINING SILICON AND CHALCOPYRITE SEMICONDUCTOR LAYERS

(75) Inventors: Wei-Lun Lu, Yilan County (TW); Feng-Chien Hsieh, Changhua County (TW); Bae-Heng Tseng, Kaohsiung County (TW)

(73) Assignee: Nexpower Technology Corp., Taichung (TW)

( * ) Notice: Subject to any disclaimer, the term of this patent is extended or adjusted under 35 U.S.C. 154(b) by 375 days.

(21) Appl. No.: 12/111,975

(22) Filed: Apr. 30, 2008

(65) Prior Publication Data

US 2009/0272432 A1 Nov. 5, 2009

(51) Int. Cl.
*H01L 31/00* (2006.01)

(52) U.S. Cl. ........ 136/252; 136/258; 136/261; 136/262; 136/264; 136/265

(58) Field of Classification Search .................... 136/256
See application file for complete search history.

(56) References Cited

U.S. PATENT DOCUMENTS

| | | | | |
|---|---|---|---|---|
| 4,612,411 | A * | 9/1986 | Wieting et al. | ............... 136/265 |
| 6,121,541 | A | 9/2000 | Arya | |
| 6,254,016 | B1 | 7/2001 | Chao | |
| 6,534,704 | B2 | 3/2003 | Hashimoto et al. | |
| 6,951,771 | B2 * | 10/2005 | Kondo et al. | ................... 438/69 |

FOREIGN PATENT DOCUMENTS

JP 2001007365 A * 1/2001

OTHER PUBLICATIONS

Vervaet, A. et al., "Screen Printing of CIS Films for CIS-CdS Solar Cells", Apr. 1991, 10th European Photovoltaic Solar Energy Conference, pp. 900-903.*
Copper Development Association, "Copper Increases Efficiency of Solar Cells", Jun. 1999, pp. 1-2.*
Yano, Yoshihiko et al., JP13007365A, Publication Date Jan. 12, 2001, English Human Translation Document, pp. 1-27.*

* cited by examiner

*Primary Examiner* — Basia Ridley
*Assistant Examiner* — Tamir Ayad
(74) *Attorney, Agent, or Firm* — Shimokaji & Associates, P.C.

(57) ABSTRACT

A solar cell includes a first electrode, a second electrode and a stacked semiconductor layer. The stacked semiconductor layer is disposed between the first electrode and the second electrode. The stacked semiconductor layer includes a first semiconductor layer, a second semiconductor layer and an intrinsic semiconductor layer. The first semiconductor layer has a first energy gap. The second semiconductor layer has a second energy gap. The intrinsic semiconductor layer is disposed between the first semiconductor layer and the second semiconductor layer, wherein the intrinsic semiconductor layer is a chalcopyrite layer and has a third energy gap. The third energy gap is less than the first energy gap and the second energy gap.

23 Claims, 4 Drawing Sheets

SOLAR CELL CONTAINING SILICON AND CHALCOPYRITE SEMICONDUCTOR LAYERS

BACKGROUND OF THE INVENTION

1. Field of the Invention

The present invention relates to a solar cell, and particularly relates to a solar cell with high light-absorbing efficiency and high optical-electrical converting efficiency, capable of lowering production cost and fabrication difficulty.

2. Description of Related Art

A solar cell has a very broad application spectrum appropriately covering electric power field (such as megawatts electric power generating system, home electric power generating system), communication field (such as wireless electric power, wireless communication), consumer electronic products (such as computer, watch, electric toy, radio receiver), traffic and transportation field (such as automobile, ship, traffic sign, road lighting, lighthouse), and agriculture field (such as water pump, irrigation).

Usually, a solar cell is formed by stacking a P-type semiconductor layer, an intrinsic semiconductor layer and an N-type semiconductor layer, wherein the materials of the P-type semiconductor layer, the intrinsic semiconductor layer and the N-type semiconductor layer are amorphous silicon. However, the intrinsic semiconductor layer made of amorphous silicon is disadvantageous in poor light-absorbing efficiency. A conventional method for solving this problem is to increase the thickness of the intrinsic semiconductor layer. However, as the thickness of the intrinsic semiconductor layer increases, the thickness of the solar cell is also increased, which raises the production cost thereof.

In addition to the above-mentioned method, another common method for enhancing light-absorbing efficiency is to repeatedly stack the P-type semiconductor layer, the intrinsic semiconductor layer and the N-type semiconductor layer to increase the number of layers. However, this method not only increases production cost and fabrication difficulty but increases internal resistance as well. Therefore, in this method, the P-type semiconductor layer, the intrinsic semiconductor layer, and the N-type semiconductor layer are not unrestrictedly stacked to achieve the purpose of increasing light-absorbing efficiency.

SUMMARY OF THE INVENTION

Accordingly, the present invention is directed to a solar cell for enhancing light-absorbing efficiency.

The present invention is also directed to a solar cell for reducing fabrication difficulty.

The present invention is further directed to a solar cell for decreasing production cost.

The present invention is further directed to a solar cell for enhancing light-absorbing efficiency without increasing the thickness of an intrinsic semiconductor layer.

The present invention is further directed to a solar cell for reducing the thickness of the solar cell.

The present invention provides a solar cell, which includes a first electrode, a second electrode, and a stacked semiconductor layer. The stacked semiconductor layer is disposed between the first electrode and the second electrode. The stacked semiconductor layer comprises a first silicon layer, a second silicon layer, and a chalcopyrite layer. The chalcopyrite layer is disposed between the first silicon layer and the second silicon layer.

According to the solar cell provided by the embodiments of the present invention, the above-mentioned chalcopyrite layer is, for example, formed by a compound represented by formula (1).

$$X-Y-Z_2 \qquad \text{Formula (1)}$$

Herein, X represents I Group elements; Y represents III Group elements; and Z represents VI Group elements.

According to the solar cell provided by the embodiments of the present invention, the X is copper; the Y is aluminum, indium or gallium; and the Z is sulfur or selenium, for example.

According to the solar cell provided by the embodiments of the present invention, the thickness of the chalcopyrite layer is between 50 Å and 50000 Å, for example.

According to the solar cell provided by the embodiments of the present invention, the specific resistance of the chalcopyrite layer is greater than $10^{-1}$ Ωcm, for example.

According to the solar cell provided by the embodiments of the present invention, a buffer layer may be further disposed between the first silicon layer and the chalcopyrite layer.

According to the solar cell provided by the embodiments of the present invention, a buffer layer may be further disposed between the second silicon layer and the chalcopyrite layer.

The present invention also provides a solar cell, which includes a first electrode, a second electrode, and a stacked semiconductor layer. The stacked semiconductor layer is disposed between the first electrode and the second electrode. The stacked semiconductor layer includes a silicon layer and a chalcopyrite layer.

The present invention further provides a solar cell, which includes a first electrode, a second electrode, a P-type silicon layer, a chalcopyrite layer, a buffer layer, and a window layer. The P-type silicon layer is disposed between the first electrode and the second electrode. The chalcopyrite layer is disposed between the P-type silicon layer and the second electrode. The buffer layer is disposed between the chalcopyrite layer and the second electrode. The window layer is disposed between the buffer layer and the second electrode.

The present invention further provides a solar cell, which includes a first electrode, a second electrode, and a stacked semiconductor layer. The stacked semiconductor layer is disposed between the first electrode and the second electrode. The stacked semiconductor layer includes a first conductive type semiconductor layer, a second conductive type semiconductor layer, and an intrinsic semiconductor layer. The intrinsic semiconductor layer is disposed between the first and the second conductive type semiconductor layers, wherein the intrinsic semiconductor layer is a chalcopyrite layer.

According to the solar cell provided by the embodiments of the present invention, a buffer layer may be further disposed between the first conductive type semiconductor layer and the intrinsic semiconductor layer.

According to the solar cell provided by the embodiments of the present invention, a buffer layer may be further disposed between the second conductive type semiconductor layer and the intrinsic semiconductor layer.

The present invention further provides a solar cell, which includes a first electrode, a second electrode, and a stacked semiconductor layer. The stacked semiconductor layer is disposed between the first electrode and the second electrode. The stacked semiconductor layer includes a first semiconductor layer, a second semiconductor layer, and an intrinsic semiconductor layer. The first semiconductor layer has a first energy gap. The second semiconductor layer has a second energy gap. The intrinsic semiconductor layer is disposed between the first semiconductor layer and the second semiconductor layer, wherein the intrinsic semiconductor layer is a chalcopyrite layer and has a third energy gap which is less than the first energy gap and the second energy gap.

According to the solar cell provided by the embodiments of the present invention, a buffer layer may be further disposed between the first semiconductor layer and the intrinsic semiconductor layer, and the buffer layer has a fourth energy gap which is greater than the first energy gap.

According to the solar cell provided by the embodiments of the present invention, a buffer layer may be further disposed between the second semiconductor layer and the intrinsic semiconductor layer, and the buffer layer has the fourth energy gap which is greater than the second energy gap.

According to the present invention, chalcopyrite is used to form the intrinsic semiconductor layer. Consequently, the light-absorbing efficiency of the intrinsic semiconductor layer is higher than that of an intrinsic semiconductor layer formed by amorphous silicon. Thereby, the thickness of the intrinsic semiconductor layer in the present invention can also be reduced to achieve the purposes of lowering the production cost and enhancing the optical-electrical converting efficiency of the solar cell.

To make the above and other objectives, features, and advantages of the present invention more comprehensible, preferable embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
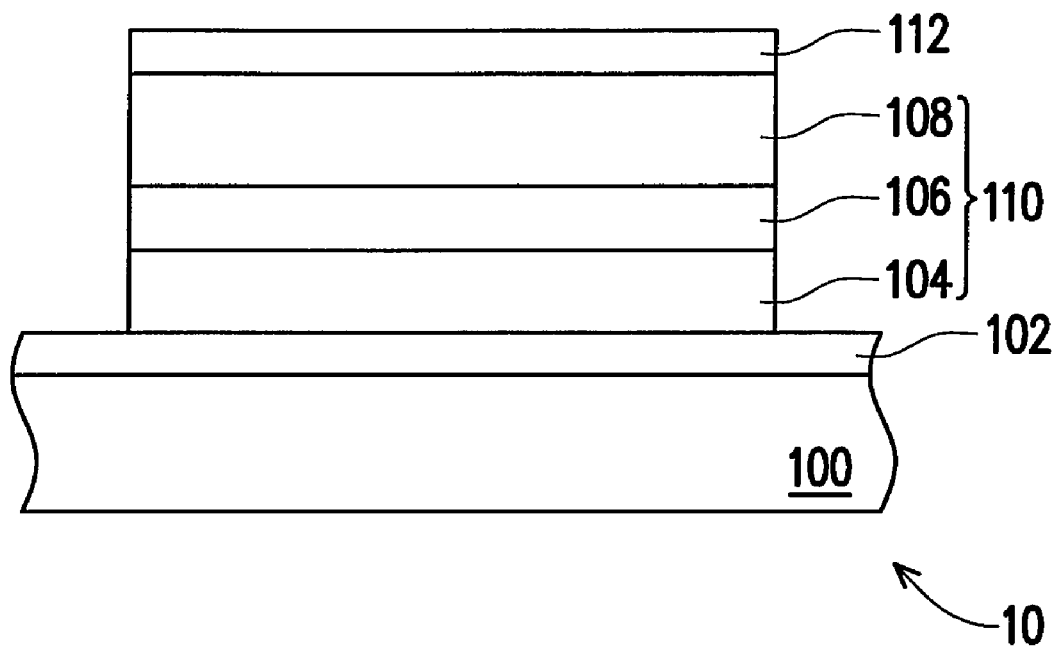
FIG. 1A illustrates a cross-sectional view of a solar cell according to an embodiment of the present invention.

FIG. 1A illustrates a cross-sectional view of a solar cell according to an embodiment of the present invention.

Referring to FIG. 1A, a solar cell 10 is disposed on a substrate 100. The solar cell 10 comprises an electrode 102, an electrode 112, and a stacked semiconductor layer 110. A material of the substrate 100 is, for example, glass. The electrode 112 is disposed on the substrate 100. A material of the electrode 112 is, for example, aluminum, silver or other alloys. A thickness of the electrode 112 is, for example, between 10 Å and 5000 Å. The electrode 102 is disposed between the substrate 100 and the electrode 112. A material of the electrode 102 is, for example, aluminum doped zinc oxide (AZO), gallium doped zinc oxide (GZO), $SnO_2$, or transparent conductive oxide (TCO). A thickness of the electrode 102 is, for example, between 50 Å and 300 Å. The stacked semiconductor layer 110 is disposed between the electrodes 102 and 112. The stacked semiconductor layer 110 comprises a silicon layer 104, a silicon layer 108, and a chalcopyrite layer 106. The silicon layer 104 is disposed between the electrodes 102 and 112, and a material of the silicon layer 104 is, for example, amorphous silicon, polysilicon, or micro-silicon. The silicon layer 108 is disposed between the silicon layer 104 and the electrode 112, and a material of the silicon layer 108 is, for example, amorphous silicon, polysilicon, or micro-silicon. The chalcopyrite layer 106 is disposed between the silicon layers 104 and 108. The chalcopyrite layer 106 is, for example, formed by a compound represented by formula (1), $$X-Y-Z_2 \qquad \text{Formula (1)},$$

wherein X represents I Group elements; Y represents III Group elements; and Z represents VI Group elements. X is copper; Y is aluminum, indium or gallium; and Z is sulfur or selenium, for example. In this embodiment, a material of the chalcopyrite layer 106 may be a $CuInSe_2$ (CIS) compound, a $CuGaSe_2$ (CGS) compound, a $Cu(In_{(1-x)}Ga_x)Se_2$ (CIGS) compound, a $CuInS_2$ compound, a $CuGaS_2$ compound, a $Cu(In,Ga)S_2$ compound, or a $Cu(In,Ga)(Se,S)_2$ compound, wherein $0 \leq x \leq 0.4$. A thickness of the chalcopyrite layer 106 is, for example, between 50 Å and 50000 Å.

Moreover, in this embodiment, the silicon layer 104 is a P-type-doped semiconductor layer and has a thickness between 10 Å and 1000 Å. When the silicon layer 104 is formed by amorphous silicon, a specific conductance of the silicon layer 104 is greater than $10^{-7} \Omega^{-1} cm^{-1}$, for example. The silicon layer 108 is an N-type-doped semiconductor layer and has a thickness between 10 Å and 1000 Å. When the silicon layer 108 is formed by amorphous silicon, a specific conductance of the silicon layer 108 is greater than $10^{-4} \Omega^{-1} cm^{-1}$, for example. Certainly, in other embodiments, the silicon layer 104 may be an N-type-doped semiconductor layer, while the silicon layer 108 may be a P-type-doped semiconductor layer. In addition, in other embodiments, the positions of the electrodes 102 and 112 may be exchanged. The chalcopyrite layer 106 serves as the intrinsic semiconductor layer disposed between the P-type semiconductor layer and the N-type semiconductor layer in the solar cell 10, and has a specific resistance greater than $10^{-1}$ $\Omega$cm, for example.

It is important that the light-absorbing efficiency of the intrinsic semiconductor layer formed by chalcopyrite is 100 times as high as that of the intrinsic semiconductor layer formed by amorphous silicon. Compared with a conventional solar cell, the solar cell 10 is able to achieve the required light-absorbing efficiency with thinner intrinsic semiconductor layer, and consequently the production cost thereof is reduced. Further, in comparison with a conventional solar cell, because the intrinsic semiconductor layer in the solar cell 10 has high light-absorbing efficiency, the intrinsic semiconductor layer can be thinner, and the thicknesses of the P-type and the N-type semiconductor layers can be reduced accordingly. Thereby, the P-type and the N-type semiconductor layers are able to form a high-potential built-in electric field to quickly separate the carriers in the intrinsic semiconductor layer from each other for easily inducting the carriers as a current. The optical-electrical converting efficiency of the solar cell 10 is therefore enhanced.

Figure 1B:
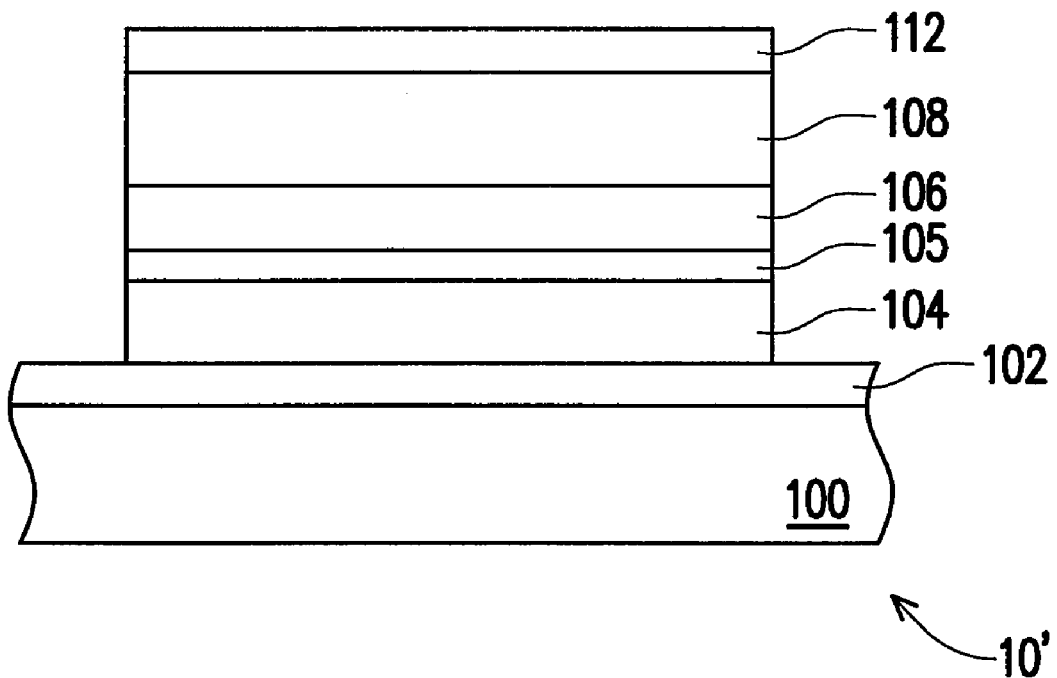
FIG. 1B illustrates a cross-sectional view of a solar cell according to another embodiment of the present invention.
Figure 1C:
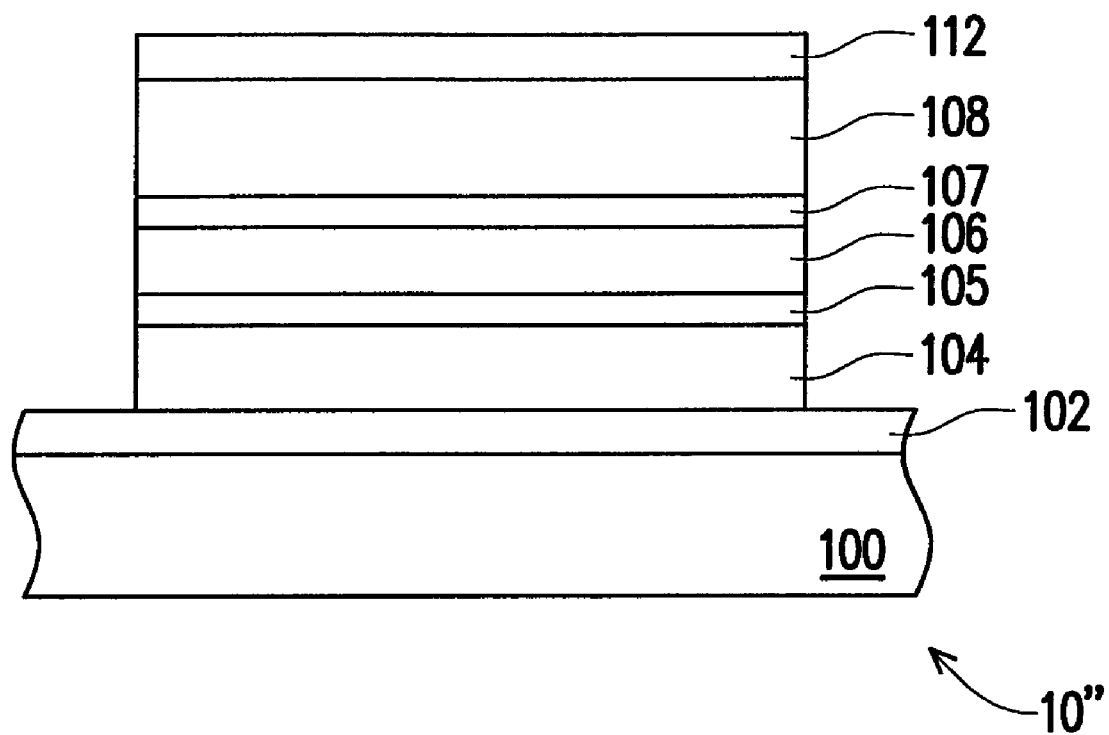
FIG. 1C illustrates a cross-sectional view of a solar cell according to yet another embodiment of the present invention.

In a solar cell 10' according to another embodiment, a buffer layer 105 (as shown in FIG. 1B) is optionally disposed between the silicon layer 104 and the chalcopyrite layer 106 to enhance the efficiency of the solar cell 10'. A material of the buffer layer 105 is, for example, SiC, SiGe, or a transparent conductive oxide. A thickness of the buffer layer 105 is, for example, between 10 Å and 5000 Å. Moreover, in a solar cell 10" according to yet another embodiment, the buffer layer 105 may be optionally disposed between the silicon layer 104 and the chalcopyrite layer 106, and a buffer layer 107 may be optionally disposed between the silicon layer 108 and the chalcopyrite layer 106 (as shown in FIG. 1C). The material and thickness of the buffer layer 107 are the same as those of the buffer layer 105. In other embodiments however, a buffer layer may be disposed between the silicon layer 108 and the chalcopyrite layer 106 only.

Figure 2A:
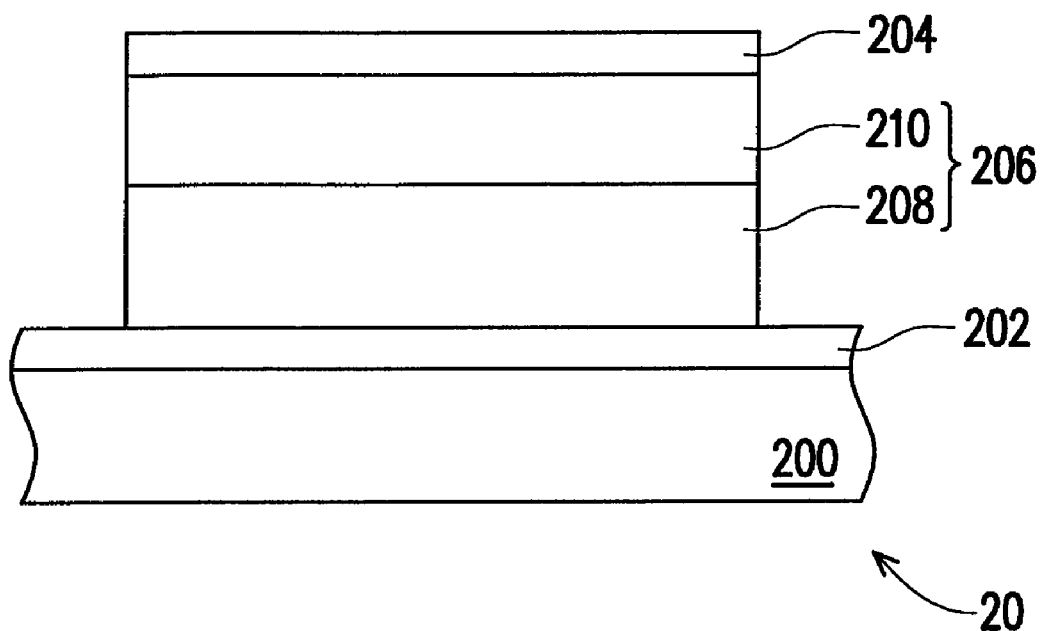
FIG. 2A illustrates a cross-sectional view of a solar cell according to yet another embodiment of the present invention.

FIG. 2A illustrates a cross-sectional view of a solar cell according to yet another embodiment of the present invention. Referring to FIG. 2A, a solar cell 20 is disposed on a substrate 200. The solar cell 20 comprises an electrode 202, an electrode 204, and a stacked semiconductor layer 206. A material of the substrate 200 is, for example, glass. The electrode 204 is disposed on the substrate 200. A material of the electrode 204 is, for example, aluminum, silver or other alloys. A thickness of the electrode 204 is, for example, between 10 Å and 5000 Å. The electrode 202 is disposed between the substrate 200 and the electrode 204. A material of the electrode 202 is, for example, molybdenum, aluminum, silver, platinum, zinc oxide or tin oxide. A thickness of the electrode 202 is, for example, between 200 Å and 30000 Å. In another embodiment, the positions of the electrodes 202 and 204 may be exchanged. In addition, the stacked semiconductor layer 206 is disposed between the electrodes 202 and 204. The stacked semiconductor layer 206 comprises a silicon layer 210 and a chalcopyrite layer 208. The silicon layer 210 is disposed between the electrodes 202 and 204, and the chalcopyrite layer 208 is disposed between the silicon layer 210 and the electrode 202. More specifically, in this embodiment, the silicon layer 210 is an N-type-doped semiconductor layer formed by amorphous silicon, polysilicon or micro-silicon, and the silicon layer 210 has a thickness between 10 Å and 1000 Å, for example. A specific conductance of the silicon layer 210 is greater than $10^{-4}\Omega^{-1}\mathrm{cm}^{-1}$. In another embodiment, the positions of the silicon layer 210 and the chalcopyrite layer 208 may be exchanged. The material and the specific resistance of the chalcopyrite layer 208 are the same as those of the chalcopyrite layer 106, and therefore detailed descriptions thereof are not repeated hereafter.

Figure 2B:
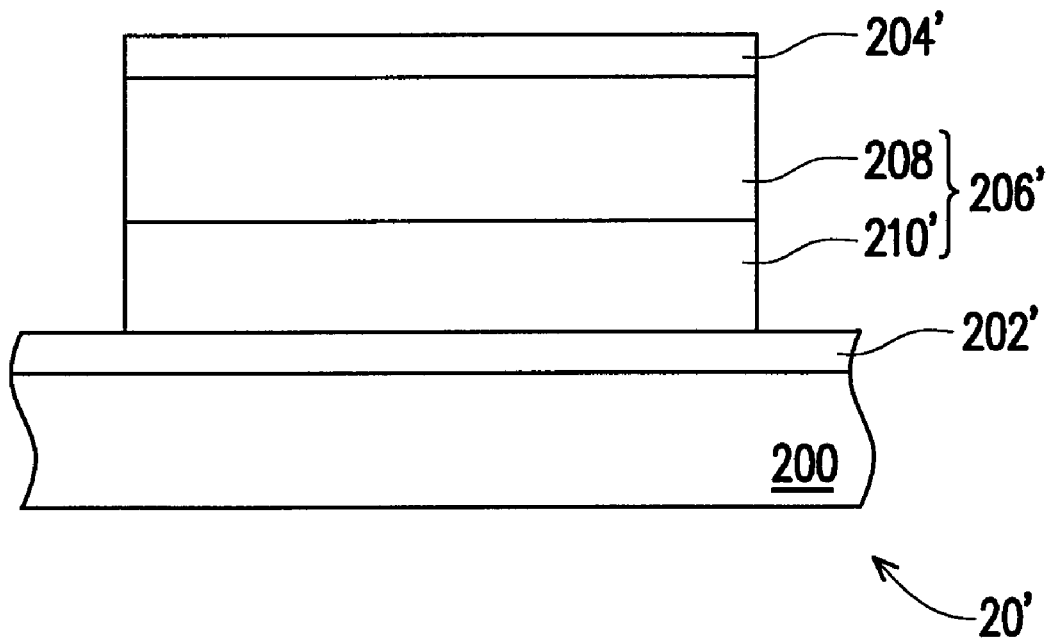
FIG. 2B illustrates a cross-sectional view of a solar cell according to yet another embodiment of the present invention.

FIG. 2B illustrates a cross-sectional view of a solar cell according to yet another embodiment of the present invention. Referring to FIG. 2B, a solar cell 20' is disposed on the substrate 200. The solar cell 20' comprises an electrode 202', an electrode 204', and a stacked semiconductor layer 206'. The electrode 204' is disposed on the substrate 200. A material of the electrode 204' is, for example, metal. A thickness of the electrode 204' is, for example, between 200 Å and 20000 Å. The electrode 202' is disposed between the substrate 200 and the electrode 204'. A material of the electrode 202' is, for example, aluminum doped zinc oxide, gallium doped zinc oxide, tin oxide, or a transparent conductive oxide. A thickness of the electrode 202' is, for example, between 50 Å and 300 Å. Similarly, in another embodiment, the positions of the electrodes 202' and 204' may be exchanged. In addition, the stacked semiconductor layer 206' is disposed between the electrodes 202' and 204'. The stacked semiconductor layer 206' comprises a silicon layer 210' and the chalcopyrite layer 208. The silicon layer 210' is disposed between the electrodes 204' and 202', and the chalcopyrite layer 208 is disposed between the silicon layer 210' and the electrode 204'. More specifically, in this embodiment, the silicon layer 210' is a P-type-doped semiconductor layer formed by amorphous silicon, polysilicon or micro-silicon, and the silicon layer 210' has a thickness between 10 Å and 1000 Å, for example. A specific conductance of the silicon layer 210' is greater than $10^{-7}\Omega^{-1}\mathrm{cm}^{-1}$. Further, the positions of the silicon layer 210' and the chalcopyrite layer 208 may be exchanged. The material and the specific resistance of the chalcopyrite layer 208 are the same as those of the chalcopyrite layer 106, and therefore detailed descriptions thereof are not repeated hereafter.

Figure 3:
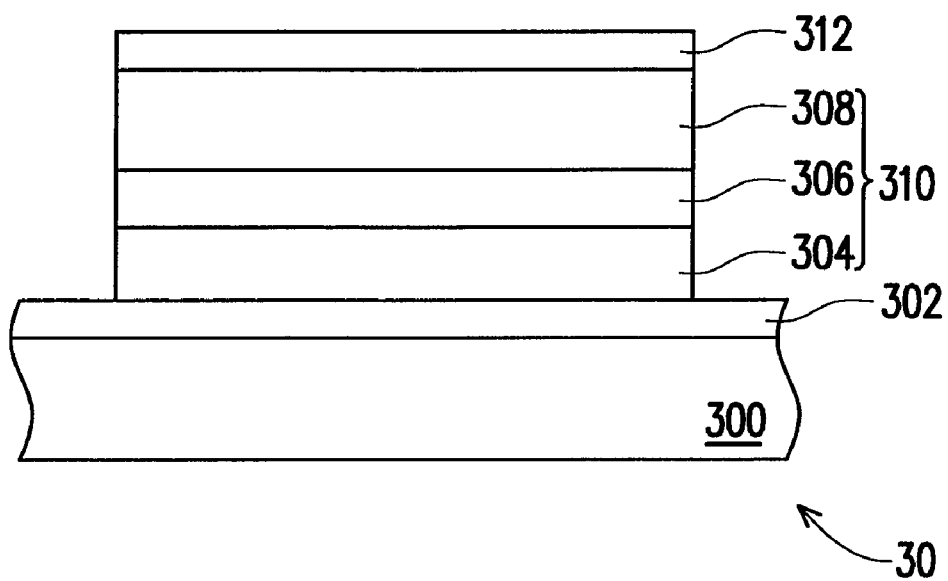
FIG. 3 illustrates a cross-sectional view of a solar cell according to yet another embodiment of the present invention.

FIG. 3 illustrates a cross-sectional view of a solar cell according to yet another embodiment of the present invention.

Referring to FIG. 3, a solar cell 30 is disposed on a substrate 300. The solar cell 30 comprises an electrode 302, an electrode 312, and a stacked semiconductor layer 310. The electrode 312 is disposed on the substrate 300. The electrode 302 is disposed between the substrate 300 and the electrode 312. The stacked semiconductor layer 310 is disposed between the electrodes 302 and 312. The stacked semiconductor layer 310 comprises a semiconductor layer 304, a semiconductor layer 308, and an intrinsic semiconductor layer 306. The semiconductor layer 304 is disposed between the electrodes 302 and 312, and has an energy gap Eg1. The semiconductor layer 308 is disposed between the semiconductor layer 304 and the electrode 312, and has an energy gap Eg2. The intrinsic semiconductor layer 306 is disposed between the semiconductor layers 304 and 308, and has an energy gap Eg3 which is less than the energy gap Eg1 and the energy gap Eg2. The material and the specific resistance of the intrinsic semiconductor layer 306 are the same as those of the chalcopyrite layer 106, and therefore detailed descriptions thereof are not repeated hereafter.

Because the energy gap Eg3 of the intrinsic semiconductor layer 306 formed by chalcopyrite is less than an energy gap of a conventional intrinsic semiconductor layer formed by amorphous silicon, the intrinsic semiconductor layer 306 is suitable for absorbing light with long wavelength, such as an infrared light. In addition, the light-absorbing efficiency of the intrinsic semiconductor layer 306 formed by chalcopyrite is about 100 times as high as that of the intrinsic semiconductor layer formed by amorphous silicon in absorbing light with certain wavelengths. Compared with a conventional solar cell, the solar cell 30 is able to achieve the required light-absorbing efficiency with thinner intrinsic semiconductor layer 306, and consequently the production cost thereof is reduced. Further, in comparison with a conventional solar cell, because the intrinsic semiconductor layer 306 in the solar cell 30 has high light-absorbing efficiency, the thicknesses of the semiconductor layers 308 and 304 respectively disposed above and under the intrinsic semiconductor layer 306 can be reduced, and consequently the semiconductor layers are able to form a high-potential built-in electric field to quickly separate the carriers in the intrinsic semiconductor layer 306 from each other. Due to the thinner thickness of the intrinsic semiconductor layer 306, the carriers are easily inducted as a current to enhance the optical-electrical converting efficiency of the solar cell 30.

Further, in other embodiments, a buffer layer having an energy gap Eg4 greater than the energy gap Eg1 is optionally disposed between the semiconductor layer 304 and the intrinsic semiconductor layer 306; or the buffer layer having the energy gap Eg4 is optionally disposed between the semiconductor layer 304 and the intrinsic semiconductor layer 306, while a buffer layer having an energy gap Eg5 greater than the energy gap Eg2 is optionally disposed between the semiconductor layer 308 and the intrinsic semiconductor layer 306. Certainly, the buffer layer having the energy gap Eg5 may be disposed between the semiconductor layer 308 and the intrinsic semiconductor layer 306 only.

Moreover, in other embodiments, a plurality of the stacked semiconductor layers 310 may be disposed between the electrodes 302 and 312, and a tunneling layer is then disposed between every two stacked semiconductor layers 310 to isolate each of the stacked semiconductor layers 310.

Figure 4:
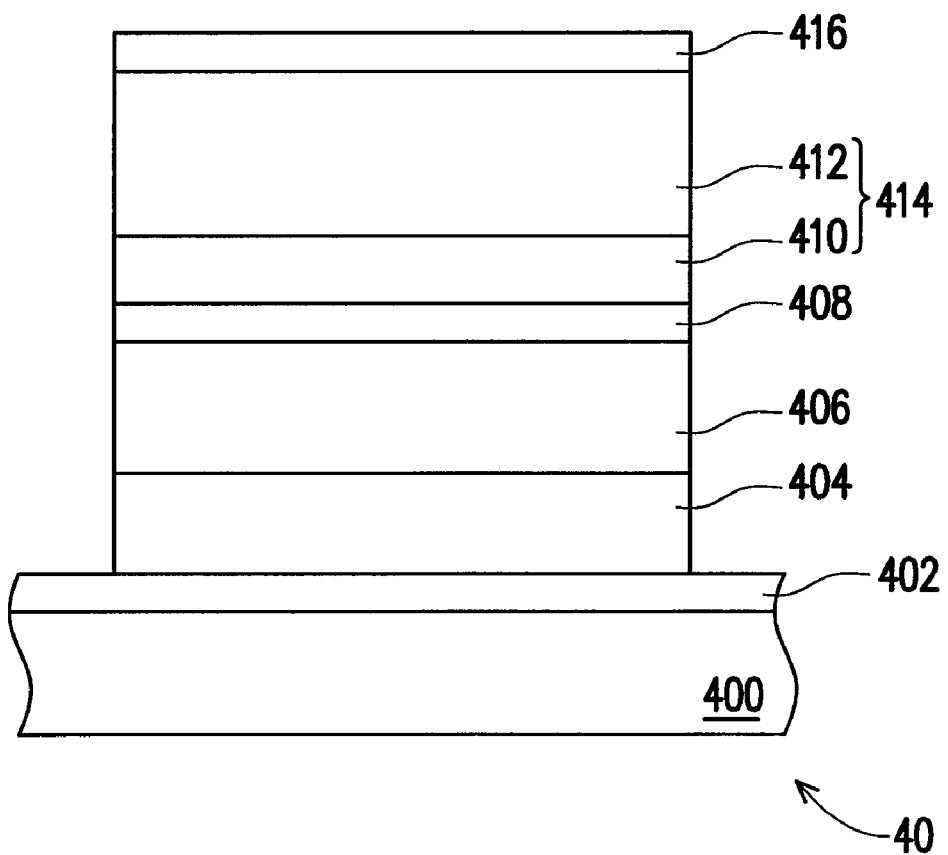
FIG. 4 illustrates a cross-sectional view of a solar cell according to yet another embodiment of the present invention.

FIG. 4 illustrates a cross-sectional view of a solar cell according to yet another embodiment of the present invention. Referring to FIG. 4, a solar cell 40 is disposed on a substrate 400. The solar cell 40 comprises an electrode 402, an electrode 416, a P-type silicon layer 404, a chalcopyrite layer 406, a buffer layer 408, and a window layer 414. A material of the substrate 400 is, for example, glass. The electrode 416 is disposed on the substrate 400. A material of the electrode 416 is, for example, aluminum, silver or other alloys. A thickness of the electrode 416 is, for example, between 10 Å and 5000 Å. A material of the electrode 402 is, for example, aluminum doped zinc oxide, gallium doped zinc oxide, tin oxide, or a transparent conductive oxide. A thickness of the electrode 402 is, for example, between 50 Å and 300 Å. The P-type silicon layer 404 is disposed between the electrodes 402 and 416. The P-type silicon layer 404 may be formed by amorphous silicon, polysilicon, or micro-silicon. A thickness of the P-type silicon layer 404 is between 10 Å and 1000 Å, and a specific conductance thereof is greater than $10^{-7}\Omega^{-1}cm^{-1}$, for example. The chalcopyrite layer 406 is disposed between the P-type silicon layer 404 and the electrode 416. The material and the specific resistance of the chalcopyrite layer 406 are the same as those of the chalcopyrite layer 106, and therefore detailed descriptions thereof are not repeated hereafter. The buffer layer 408 is disposed between the chalcopyrite layer 406 and the electrode 416. A material of the buffer layer 408 is, for example, an II-VI Group compound, SiC, SiGe, or a transparent conductive oxide. A thickness of the buffer layer 408 is, for example, between 10 Å and 1000 Å. The window layer 414 is disposed between the buffer layer 408 and the electrode 416. In this embodiment, the window layer 414 is, for example, a multiple layer formed by a zinc oxide layer 410 and an aluminum doped zinc oxide layer 412 above. The zinc oxide layer 410 has a thickness between 100 Å and 1000 Å, and the aluminum doped zinc oxide layer 412 has a thickness between 1000 Å and 20000 Å, for example. The window layer 414 is used for obtaining the transmittance of a larger range of wavelengths and increasing the conductivity of a device.

To conclude, chalcopyrite is used to form the intrinsic semiconductor layer in the solar cell of the present invention. Consequently, the light-absorbing efficiency of the intrinsic semiconductor layer in the present invention is higher than that of a conventional intrinsic semiconductor layer formed by amorphous silicon.

For this reason, the thickness of the intrinsic semiconductor layer in the present invention can be reduced to achieve the purposes of lowering the production cost and enhancing the optical-electrical converting efficiency of the solar cell.

What is claimed is:
1. A solar cell, comprising:
a substrate;
a first electrode adjacent the substrate;
a second electrode; and
a stacked semiconductor layer disposed between the first electrode and the second electrode, comprising:
a p-type silicon layer; and
a chalcopyrite layer disposed in direct physical contact with the p-type silicon layer and in direct physical contact with the second electrode.
2. The solar cell as claimed in claim 1, wherein a material of the chalcopyrite layer comprises a compound represented by formula (I),

$$X\text{—}Y\text{—}Z_2 \qquad\qquad \text{Formula (I)},$$

wherein X represents I Group elements; Y represents I11 Group elements; and Z represents VI Group elements.
3. The solar cell as claimed in claim 2, wherein X is copper; Y is aluminum, indium or gallium; and Z is sulfur or selenium.
4. The solar cell as claimed in claim 1, wherein a thickness of the chalcopyrite layer is between 50 Å and 50000 Å.
5. The solar cell as claimed in claim 1, wherein a specific resistance of the chalcopyrite layer is greater than $10^{-1}$ Ωcm.
6. The solar cell as claimed in claim 1, further comprising a buffer layer disposed between the p-type silicon layer and the chalcopyrite layer.
7. A solar cell, comprising:
a first electrode adjacent a substrate;
a second electrode; and
a stacked semiconductor layer disposed between the first electrode and the second electrode, comprising:
an n-type silicon layer; and
a chalcopyrite layer;
wherein the n-type silicon layer is in direct physical contact with the first electrode;
wherein the chalcopyrite layer is in direct physical contact with the n-type silicon layer and the second electrode;
wherein the first electrode comprises transparent conductive oxide.
8. The solar cell as claimed in claim 7, wherein a material of the chalcopyrite layer comprises a compound represented by formula (I), $$X\text{—}Y\text{—}Z_2 \qquad\qquad \text{Formula (I)},$$

wherein X represents I Group elements; Y represents III Group elements; and Z represents VI Group elements.
9. The solar cell as claimed in claim 8, wherein X is copper; Y is aluminum, indium or gallium; and Z is sulfur or selenium.
10. The solar cell as claimed in claim 7, wherein a thickness of the chalcopyrite layer is between 50 Å and 50000 Å.
11. The solar cell as claimed in claim 7, wherein a specific resistance of the chalcopyrite layer is greater than $10^{-1}$ Ωcm.
12. A solar cell, comprising:
a first electrode adjacent a substrate;
a second electrode;
a P-type amorphous silicon layer disposed between the first electrode and the second electrode;
a chalcopyrite layer disposed between the P-type silicon layer and the second electrode and in direct physical contact with the first electrode;
a buffer layer disposed between the chalcopyrite layer and the second electrode; and
a multiple layer window layer disposed between the buffer layer and the second electrode;
the window layer comprising a zinc oxide layer and an aluminum doped zinc oxide layer.
13. The solar cell as claimed in claim 12, wherein a material of the chalcopyrite layer comprises a compound represented by formula (1), $$X\text{—}Y\text{—}Z_2 \qquad\qquad \text{Formula (I)},$$

wherein X represents I Group elements; Y represents I11 Group elements; and Z represents VI Group elements.

14. The solar cell as claimed in claim 13, wherein X is copper; Y is aluminum, indium or gallium; and Z is sulfur or selenium.

15. The solar cell as claimed in claim 12, wherein a thickness of the chalcopyrite layer is between 50 Å and 50000 Å.

16. The solar cell as claimed in claim 12, wherein a specific resistance of the chalcopyrite layer is greater than $10^{-1}$ Ωcm.

17. A solar cell, comprising:
a first electrode;
a second electrode; and
a plurality of stacked semiconductor layers disposed between the first electrode and the second electrode; and
a tunneling layer disposed between every two stacked semiconductor layers to isolate each of the stacked semiconductor layers;
one or more of the stacked semiconductor layers comprising:
a first conductive type semiconductor layer;
a second conductive type semiconductor layer, at least one of said conductive type semiconductor layers being silicon; and
an intrinsic semiconductor layer disposed between the first and the second conductive type semiconductor layers and in direct physical contact with said silicon semiconductor layer, wherein the intrinsic semiconductor layer is a chalcopyrite layer;
the first semiconductor layer having a first energy gag;
the second semiconductor layer having a second energy gap; and
the intrinsic semiconductor layer having a third energy gap which is less than the first energy gap and the second energy gap.

18. The solar cell as claimed in claim 17, wherein a material of the chalcopyrite layer comprises a compound represented by formula (1), $$X\text{—}Y\text{—}Z_2 \qquad \text{Formula (I)},$$

wherein X represents I Group elements; Y represents I11 Group elements; and Z represents VI Group elements.

19. The solar cell as claimed in claim 18, wherein X is copper; Y is aluminum, indium or gallium; and Z is sulfur or selenium.

20. The solar cell as claimed in claim 17, wherein a thickness of the chalcopyrite layer is between 50 Å and 50000 Å.

21. The solar cell as claimed in claim 17, wherein a specific resistance of the chalcopyrite layer is greater than $10^{-1}$ Ωcm.

22. The solar cell as claimed in claim 17, further comprising a buffer layer disposed between the first conductive type semiconductor layer and the intrinsic semiconductor layer the buffer layer having a fourth energy gap which is greater than the first energy gap.

23. The solar cell as claimed in claim 17, further comprising a buffer layer disposed between the second semiconductor layer and the intrinsic semiconductor layer, and the buffer layer having a fourth energy gap which is greater than the second energy gap.

* * * * *